US006933442B2

(12) United States Patent
Franks, Jr.

(10) Patent No.: US 6,933,442 B2
(45) Date of Patent: Aug. 23, 2005

(54) METHODS AND APPARATUS TO SECURE A GROUND STRAP ASSEMBLY TO AN ELECTRICALLY CONDUCTIVE MEMBER

(75) Inventor: George J. Franks, Jr., Inverness, IL (US)

(73) Assignee: Senior Industries, Inc., Wood Dale, IL (US)

(*) Notice: Subject to any disclaimer, the term of this patent is extended or adjusted under 35 U.S.C. 154(b) by 0 days.

(21) Appl. No.: 10/713,442

(22) Filed: Nov. 14, 2003

(65) Prior Publication Data

US 2004/0154818 A1 Aug. 12, 2004

Related U.S. Application Data

(63) Continuation-in-part of application No. 10/365,293, filed on Feb. 12, 2003, now Pat. No. 6,727,430.

(51) Int. Cl.[7] .................. H05K 5/02

(52) U.S. Cl. .................. 174/51; 174/40 CC; 174/135; 174/6; 439/98; 361/799

(58) Field of Search .................. 174/51, 40 CC, 174/6, 135; 439/507, 98, 92, 811, 812; 361/704, 799

(56) References Cited

U.S. PATENT DOCUMENTS

| | | | |
|---|---|---|---|
| 807,497 | A | 12/1905 | Reeve et al. |
| 846,400 | A | 3/1907 | Cox |
| 907,542 | A | 12/1908 | Vogel |
| 972,489 | A | 10/1910 | Adams |
| 1,250,467 | A | 12/1917 | Johnson |
| 1,418,650 | A | 6/1922 | Johnson |
| 1,505,314 | A | 8/1924 | Cox |
| 1,552,932 | A | 9/1925 | Kessler |
| 1,675,163 | A | 6/1928 | Colburn |
| 1,839,254 | A | 1/1932 | Pearson et al. |

(Continued)

FOREIGN PATENT DOCUMENTS

| | | |
|---|---|---|
| CH | 150427 | * 10/1931 |
| DE | 373689 | * 9/1920 |

OTHER PUBLICATIONS

Allied Bolt, Inc. Drop Wire Hard Ware, Product Catalog, undated, p. 37. no date.
Three photographs of Electric Motion ground strap UL FM 5510 DB, undated, 3 pages. no date.
Three photographs of Sachs ground strap UL 99N9, undated, 3 pages. no date.
Three photographs of Diamond ground strap 3C36, undated, 3 pages. not readable.
Three photographs of Allied Bolt ground clamp corresponding to U.S. Appl. No. 6,398,596, 3 pages. Note: photographs are very poor & not readable.

*Primary Examiner*—Dhiru R. Patel
(74) *Attorney, Agent, or Firm*—Bell, Boyd & Lloyd LLC

(57) ABSTRACT

A grounding connector having at least a first layer and a second layer. A conductor, such as a grounding wire, is secured between the first layer and the second layer. The first and second layers are made of a material with the same or similar galvanic potentials as the conductor such that galvanic corrosion between the conductor and the first and second layers is minimized.

35 Claims, 7 Drawing Sheets

U.S. PATENT DOCUMENTS

| | | | | | |
|---|---|---|---|---|---|
| 2,061,463 | A | | 11/1936 | Hall | |
| 2,114,752 | A | | 4/1938 | Tallman | |
| 2,190,824 | A | | 2/1940 | Cook | |
| 2,210,750 | A | | 8/1940 | Cook et al. | |
| 2,423,627 | A | | 7/1947 | Tinnerman | |
| 2,532,068 | A | | 11/1950 | Larsen | |
| 2,681,196 | A | | 6/1954 | Lind | |
| 2,795,770 | A | | 6/1957 | Toedtman | |
| 3,040,477 | A | | 6/1962 | June | |
| 3,187,299 | A | | 6/1965 | Marta | |
| 3,353,145 | A | | 11/1967 | Sodderland et al. | |
| 3,562,701 | A | | 2/1971 | Orr | |
| 3,760,342 | A | | 9/1973 | Prouty et al. | |
| D233,733 | S | | 11/1974 | Byerly | |
| 3,924,920 | A | * | 12/1975 | Moscioni et al. | 439/781 |
| 4,002,869 | A | | 1/1977 | Taccetta et al. | |
| 4,026,619 | A | | 5/1977 | Gillemot | |
| 4,103,986 | A | | 8/1978 | Izraeli | |
| D269,155 | S | | 5/1983 | Rose | |
| 4,526,428 | A | * | 7/1985 | Sachs | 439/92 |
| 4,591,229 | A | | 5/1986 | Sachs | |
| 4,623,204 | A | | 11/1986 | Auclair | |
| 4,626,051 | A | | 12/1986 | Franks, Jr. | |
| 4,664,469 | A | | 5/1987 | Sachs | |
| 4,780,096 | A | | 10/1988 | Franks, Jr. | |
| D301,303 | S | | 5/1989 | Hoover | |
| 4,828,504 | A | | 5/1989 | Franks, Jr. | |
| 4,925,395 | A | | 5/1990 | Franks, Jr. | |
| 4,944,683 | A | | 7/1990 | Leonardo | |
| D313,392 | S | | 1/1991 | Sachs | |
| 4,993,960 | A | | 2/1991 | Franks, Jr. | |
| 5,006,074 | A | | 4/1991 | Franks, Jr. | |
| D323,973 | S | | 2/1992 | Sachs | |
| D323,974 | S | | 2/1992 | Sachs | |
| 5,131,856 | A | | 7/1992 | Auclair | |
| D331,358 | S | | 12/1992 | Sachs | |
| D335,079 | S | | 4/1993 | Sachs | |
| D342,013 | S | | 12/1993 | Sachs | |
| 5,314,343 | A | | 5/1994 | Englander | |
| 5,616,036 | A | | 4/1997 | Polidori | |
| 5,642,739 | A | | 7/1997 | Fareed | |
| 5,674,079 | A | * | 10/1997 | Auclair | 439/92 |
| 5,768,036 | A | | 6/1998 | Nakagishi et al. | |
| D398,218 | S | | 9/1998 | Coll et al. | |
| 6,011,218 | A | | 1/2000 | Burek et al. | |
| 6,322,378 | B1 | | 11/2001 | Auclair | |
| 6,398,596 | B1 | | 6/2002 | Malin | |
| 6,475,038 | B1 | | 11/2002 | Franck | |
| 6,652,295 | B1 | * | 11/2003 | Glass et al. | 439/94 |

* cited by examiner

Fig. 1
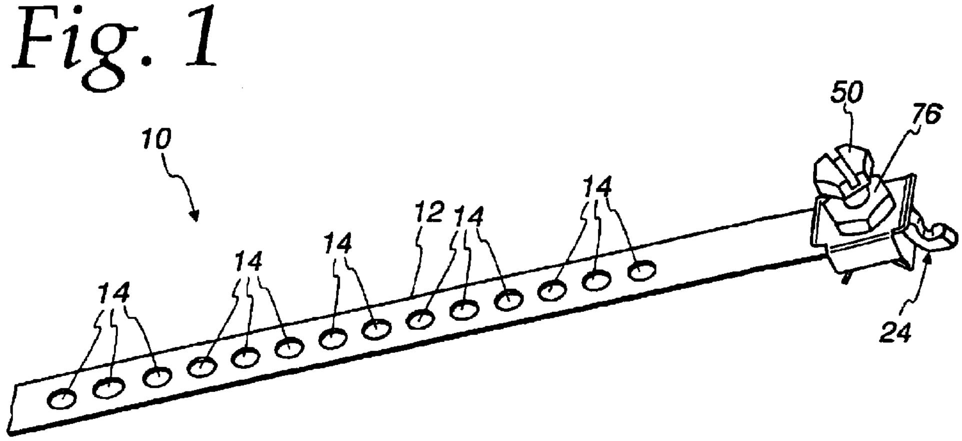
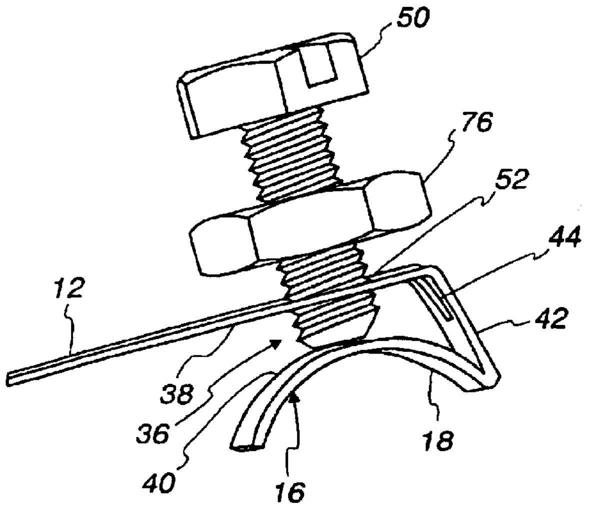
Fig. 2
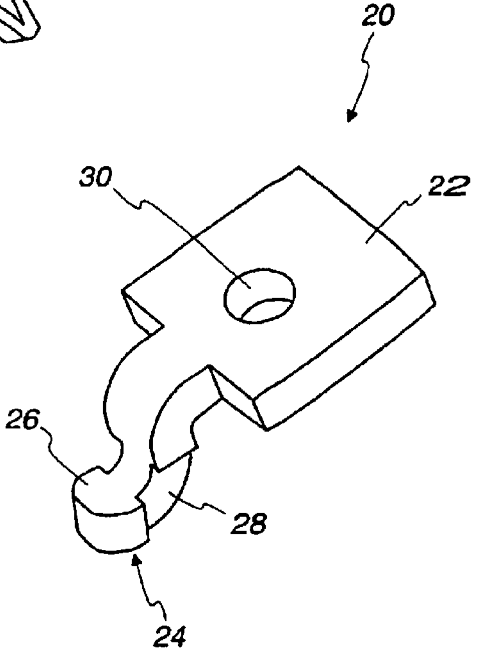
Fig. 3

Fig. 4
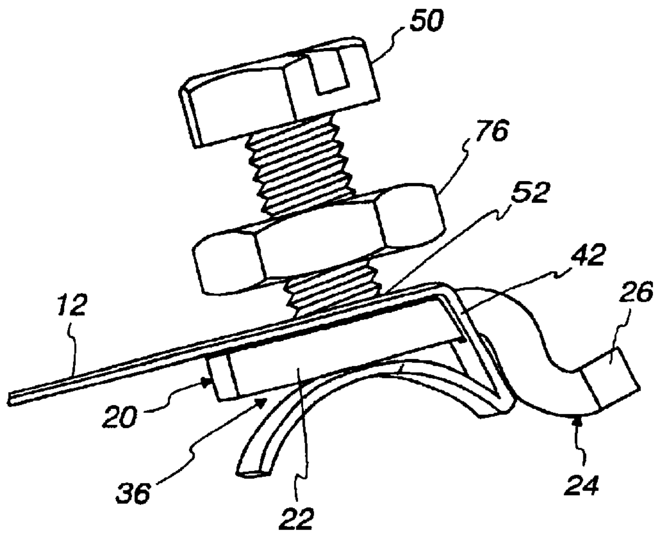
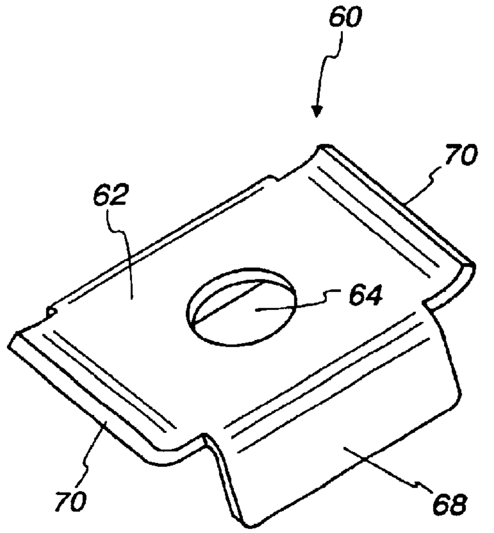
Fig. 5
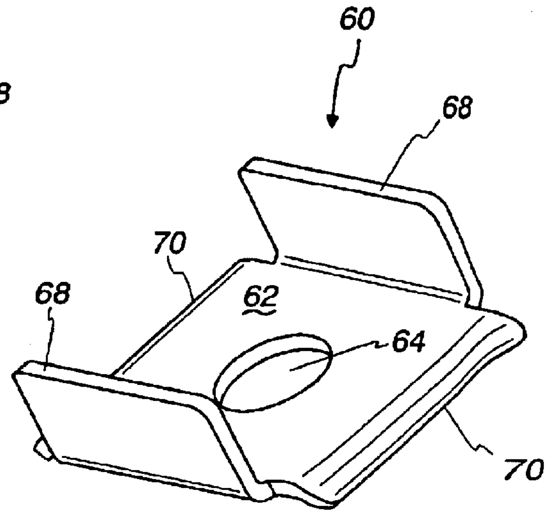
Fig. 6

Fig. 13
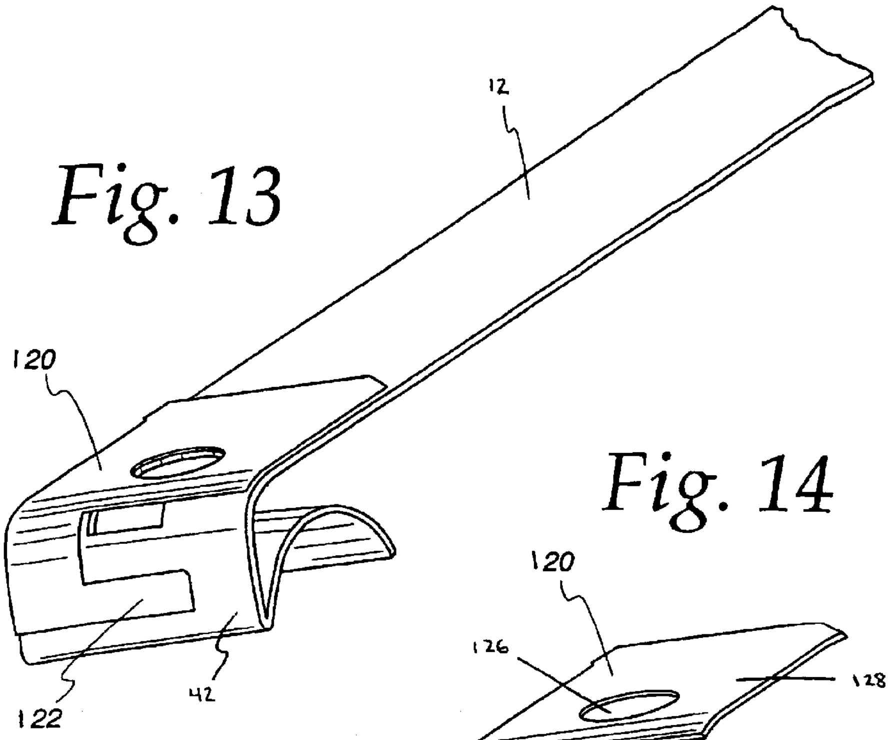
Fig. 14
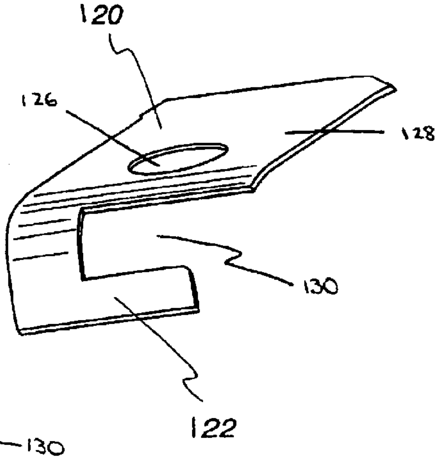
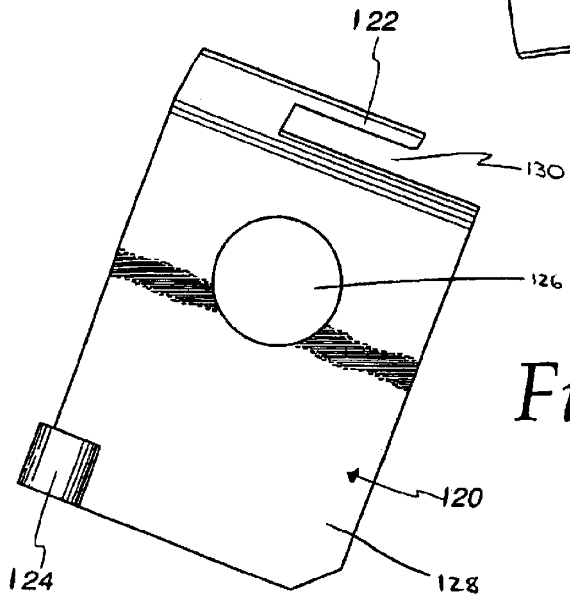
Fig. 15

METHODS AND APPARATUS TO SECURE A GROUND STRAP ASSEMBLY TO AN ELECTRICALLY CONDUCTIVE MEMBER

CROSS-REFERENCE TO RELATED APPLICATION

This application is a continuation-in-part of application Ser. No. 10/365,293, filed on Feb. 12, 2003 now U.S. Pat. No. 6,727,430.

FIELD OF THE INVENTION

This disclosure relates generally to electrical grounding, and, more particularly, to methods and apparatus to secure a ground wire to an electrically conductive structure.

BACKGROUND OF THE INVENTION

It is known to use prior art ground strap assemblies to secure a ground wire to an electrically conductive structure, such as a plumbing pipe, a mast, etc. Such prior art strap assemblies typically include a bendable ground strap defining a plurality of bores, a fastener that can be passed through two of the bores in the bendable ground strap and secured thereto via a threaded member, and a ground nut which secures a ground wire in electrically conductive contact with the bendable strap. To secure the prior art ground strap assemblies to an electrically conductive structure, the fastener and ground nut are typically removed, and the bendable ground strap is wrapped around the electrically conductive structure such that it overlays itself in the location where the fastener is to secure the ground nut and the ground wire to the bendable ground strap. Specifically, two of the bores defined in the bendable strap are brought into registration and the fastener is passed through the aligned bores and threaded into the threaded member. Thus, prior art ground strap assemblies typically require removal of a fastener from a bendable strap and, after which the bendable strap is generally positioned in its intended environment of use and the fastener is re-inserted into the bores of the bendable ground strap.

The ground nuts of prior art grounding straps are typically implemented by conventional hex nuts. It is, thus, usually necessary to rotate the hex nut relative to the fastener to couple a ground wire to a prior art grounding strap. Such rotation of the hex nut occurs after the grounding wire is positioned beneath the hex nut. As a result, the installer must exert effort to ensure the ground wire does not separate from between the hex nut and the bendable ground strap while the hex nut is being tightened.

BRIEF DESCRIPTION OF THE DRAWINGS

FIG. 1 is a perspective view of an example ground strap assembly;

FIG. 2 is an enlarged side, perspective view of an end of the strap assembly of FIG. 1, but showing the end of the strap assembly from the side with the grounding clip and the threaded member removed;

FIG. 3 is a perspective view of the threaded member of FIG. 1;

FIG. 4 is a view similar to FIG. 2, but including the threaded member;

FIG. 5 is a top perspective view of an example grounding clip;

FIG. 6 is a bottom perspective view of the grounding clip of FIG. 5;

FIG. 13 is an enlarged perspective view of the ground strap of FIG. 11 showing the bendable ground strap and the ground shim;

FIG. 14 is a perspective view of the ground shim of FIG. 13;

FIG. 15 is a plan view of the ground shim of FIG. 14 as seen from the underside of the ground shim.

DETAILED DESCRIPTION OF THE PREFERRED EMBODIMENT(S)

Figure 7:
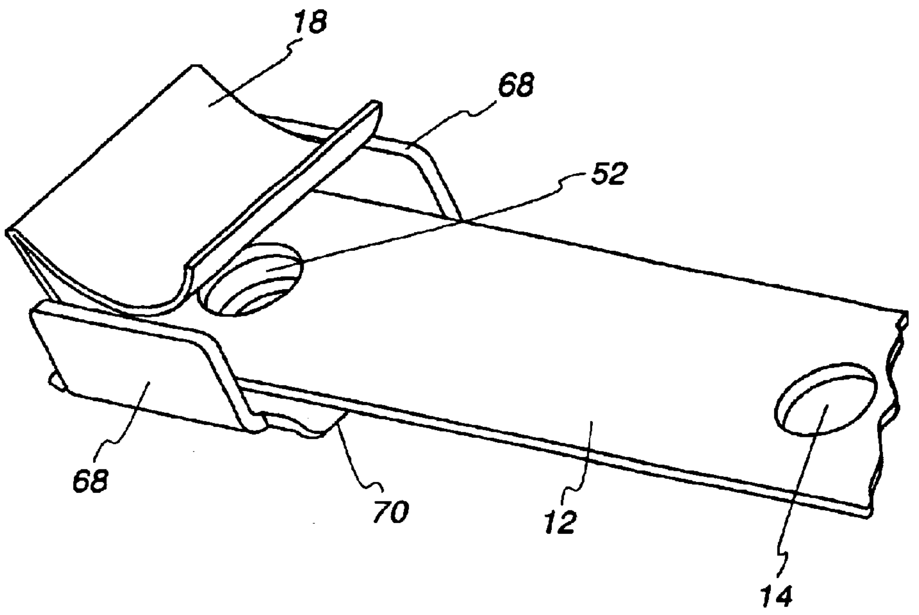
FIG. 7 is a bottom perspective view of the strap assembly of FIG. 1, but excluding the threaded member, the fastener and the ground nut.

FIG. 1 is a perspective view of an example grounding strap assembly 10. The grounding strap assembly 10 is adapted to secure a conductor 11 (see FIG. 10) to an electrically conductive structure 13 (see FIGS. 9 and 10), such as a plumbing pipe, a mast, etc. To this end, the grounding strap assembly 10 is provided with a bendable ground strap 12. The strap 12 may be implemented by a thin strip of galvanized steel, copper, or other conductive metal. In the example of FIG. 1, the ground strap 12 is approximately one-half inch wide and several inches long, but persons of ordinary skill in the art will readily appreciate that straps of other dimensions would likewise be appropriate.

As shown in FIG. 1, the bendable ground strap 12 is penetrated by a series of hook apertures or bores 14. The hook apertures 14 are stamped into the strap 12 along a line beginning near a first end of the strap. In the illustrated example, the hook apertures 14 are evenly spaced from one another and are centered on the longitudinal center axis of the ground strap 12.

Figure 9:
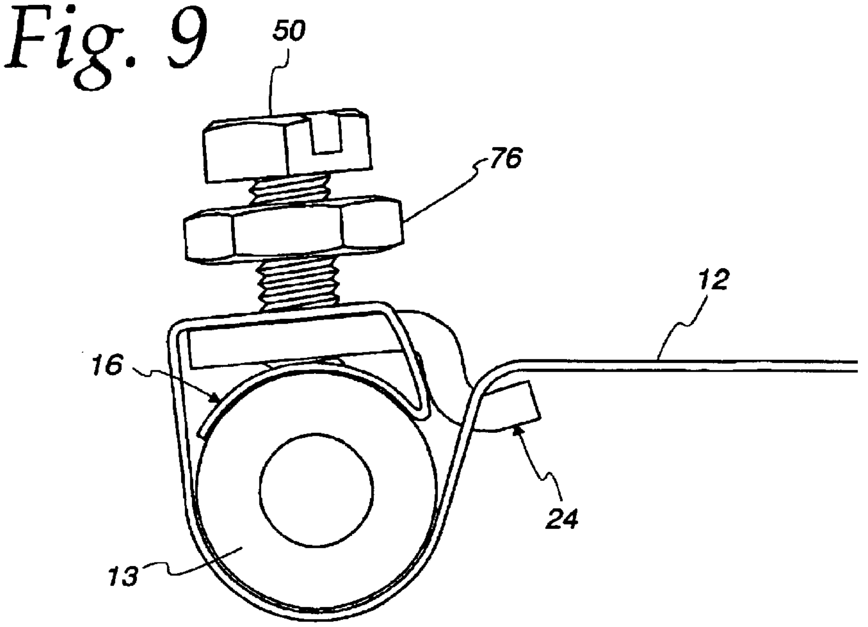
FIG. 9 is a side view of the ground strap assembly of FIG. 1 mounted on an electrically conductive member shown with the grounding clip removed.
Figure 10:
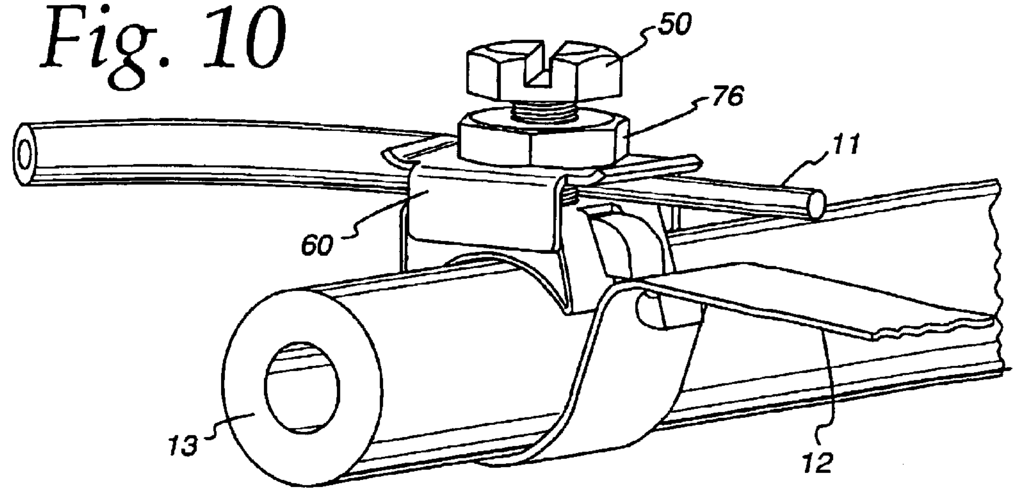
FIG. 10 is a perspective view of the ground strap of FIG. 1 mounted on an electrically conductive member and showing an attached ground wire.
Figure 11:
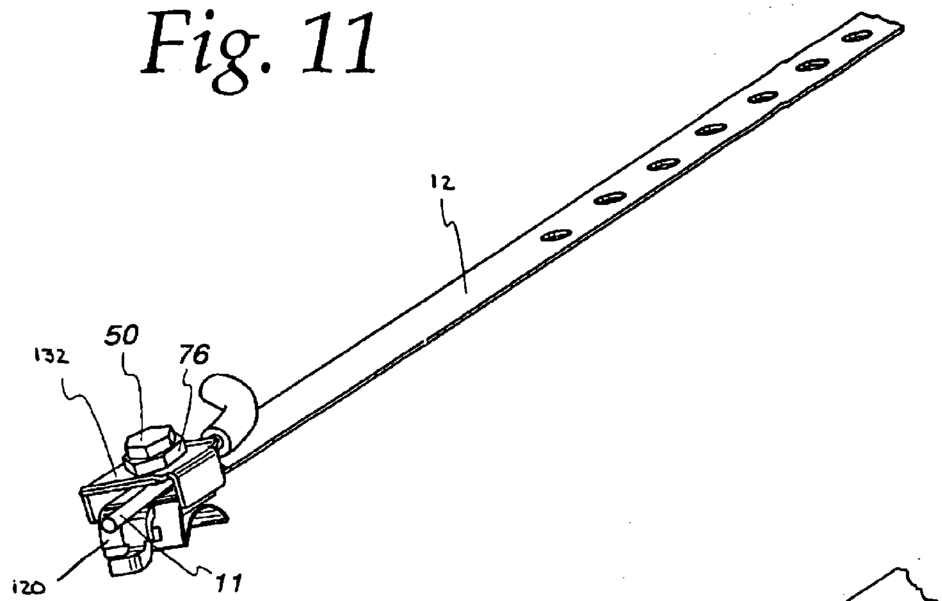
FIG. 11 is a perspective view of a ground strap assembly embodying features of the present invention.
Figure 12:
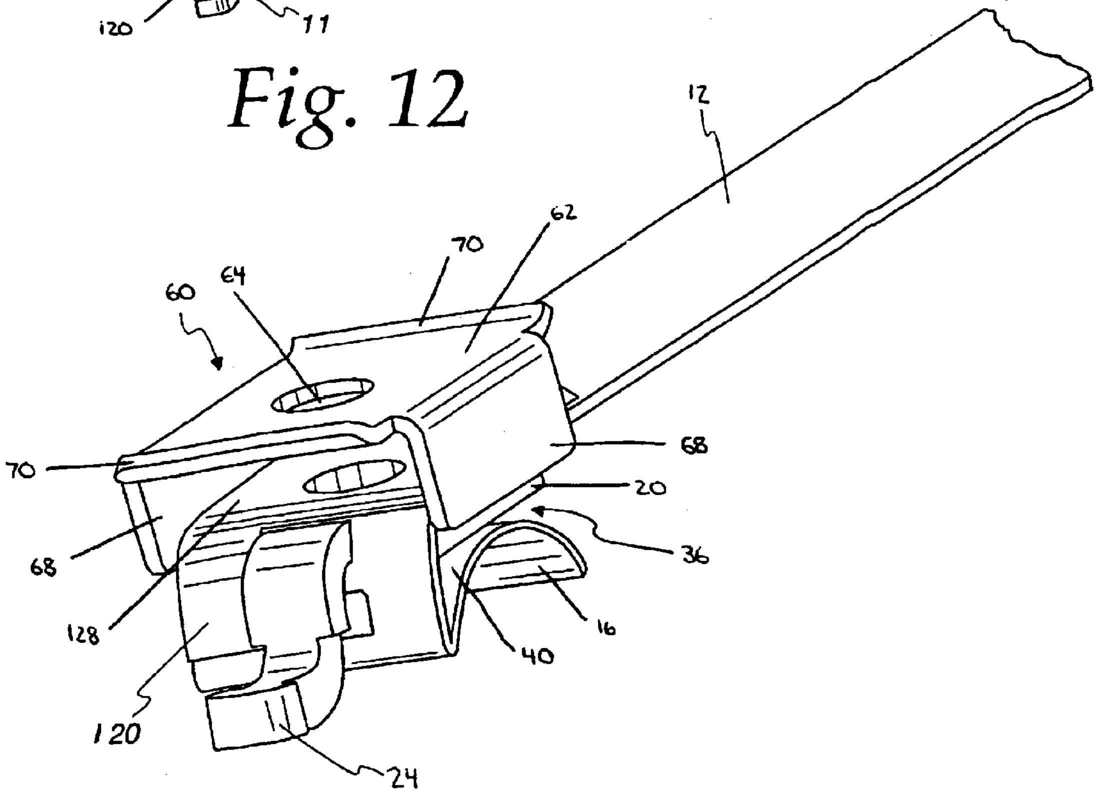
FIG. 12 is an enlarged perspective view of the ground strap of FIG. 11, showing the end of the strap assembly with the grounding clip and the threaded member removed.

For the purpose of engaging an electrically conductive structure 13, a second end of the bendable ground strap 12 is formed into an arc 16 as shown in FIG. 2. The bottom surface 18 of the arc 16 is intended to mate with an outer circumference of a cylindrical electrically conductive member 13 in a conventional fashion as shown in FIGS. 9 and 10.

To secure the bendable ground strap 12 around an electrically conductive member 13, the ground strap 12 is further provided with a threaded member 20. As shown in FIG. 3, the threaded member 20 of the illustrated example includes a rectilinear body 22 and a hook 24 which extends downwardly and outwardly from the body 22. The body 22 is, thus, located in a first plane and the hook 24 includes a point or head 26 which is located in a second plane below the first plane. The point 26 of the illustrated hook 24 is joined to the body 22 by an S-shaped shank 28. As shown in FIG. 3, in the illustrated example the point 26 has a greater width than the shank 28.

As shown in FIG. 3, the body 22 of the threaded member 20 defines a threaded bore 30. The threaded bore 30 is dimensioned to mate with a fastener 50 as discussed below, and is located at generally the center of the body 22. The threaded bore 30 penetrates the entire depth of the body 22 to permit the fastener 50 to pass through the body 22. The threaded member 20 may be implemented from any desired material, but in the illustrated example, it is made of galvanized steel.

In the example illustrated in FIG. 2, the second end of the strap 12 is bent downward and backward to define a capture space 36 above the arc 16. More specifically, the capture space 36 is bounded on three sides by an undersurface portion 38 of the strap 12, an upper surface 40 of the arc 16, and a joining segment 42 of the strap 12 coupling the undersurface portion 38 and the arc 16.

To permit location of the threaded member 20 in the capture space 36, the joining segment 42 defines a bore 44. The bore 44 is positioned to receive the hook 24 of the threaded member 20 such that the hook 24 extends through the joining segment 42 of the strap 12. Thus, as most easily seen in FIG. 4, when the threaded member 20 is positioned in the capture space 36, the body 22 and bore 30 of the threaded member 20 are located on one side of the joining segment 42 of the strap 12 and the head 26 of the hook 24 is located on an opposite side of the joining segment 42.

For the purpose of securing the threaded member 20 within the capture space 36, the ground strap assembly 10 is further provided with a fastener 50. As shown in FIGS. 3 and 4, the fastener 50 passes through a bore 52 defined in the strap 12 (see FIG. 7) and threads into the threaded bore 30 of the threaded member 20. The fastener 50 may be threaded completely through the threaded bore 30 and into engagement with the upper surface 40 of the arc 16 as shown in FIG. 2. The fastener 50 may be implemented by any conventional fastener, but in the illustrate example it is implemented by a brass screw having a slotted hexagonal head.

In order to connect a conductor 11 to the strap 12, the grounding strap assembly 10 is further provided with a grounding clip 60. As shown in FIGS. 5 and 6, the illustrated grounding clip 60 includes a generally planar body 62. The body 62 defines a bore 64 for receiving the fastener 50 as explained in further detail below.

To substantially prevent rotation of the grounding clip 60 relative to the strap 12, the grounding clip 60 is further provided with flanges 68 which extend downwardly from the body 62. As most easily seen in FIGS. 6 and 7, the flanges 68 are spaced apart to receive the strap 12 therebetween. When the strap 12 is positioned between the flanges 68, each of the flanges 68 is immediately adjacent an opposite side of the strap 12. Engagement of a flange 68 and a side surface of the strap 12 substantially prevents the grounding clip 60 from rotating relative to the strap 12 about the central axis of the bore 64 (i.e., an axis which is substantially perpendicular to the body 62).

To facilitate insertion of a conductor 11 (see FIG. 10) beneath the body 62 of the grounding clip 60, the grounding clip 60 is further provided with upwardly oriented flanges 70. As most easily seen in FIG. 5, a first upwardly oriented flange 70 is located at a first end of the body 62 and a second upwardly oriented flange 70 is located at a second end opposite the first end of the body 62. Thus, the body 62 joins the upwardly oriented flanges 70 and the downwardly oriented flanges 68 into a unitary structure. Persons of ordinary skill in the art will appreciate that although the illustrated example includes two upwardly oriented flanges 70, a different number of such flanges 70 (including, for example, zero, one, three, etc.) may alternatively be employed. Two, oppositely disposed flanges 70, are currently preferred, however, to facilitate insertion of the ground wire from either side of the grounding clip 60. Making the grounding clip 60 symmetrical with respect to the upwardly oriented flanges 70 and the downwardly oriented flanges 68 is also preferred because it simplifies the assembly of the clip 60 to the strap 12 in that the clip 60 may be oriented in either direction without any difference in functionality or appearance.

Figure 8:
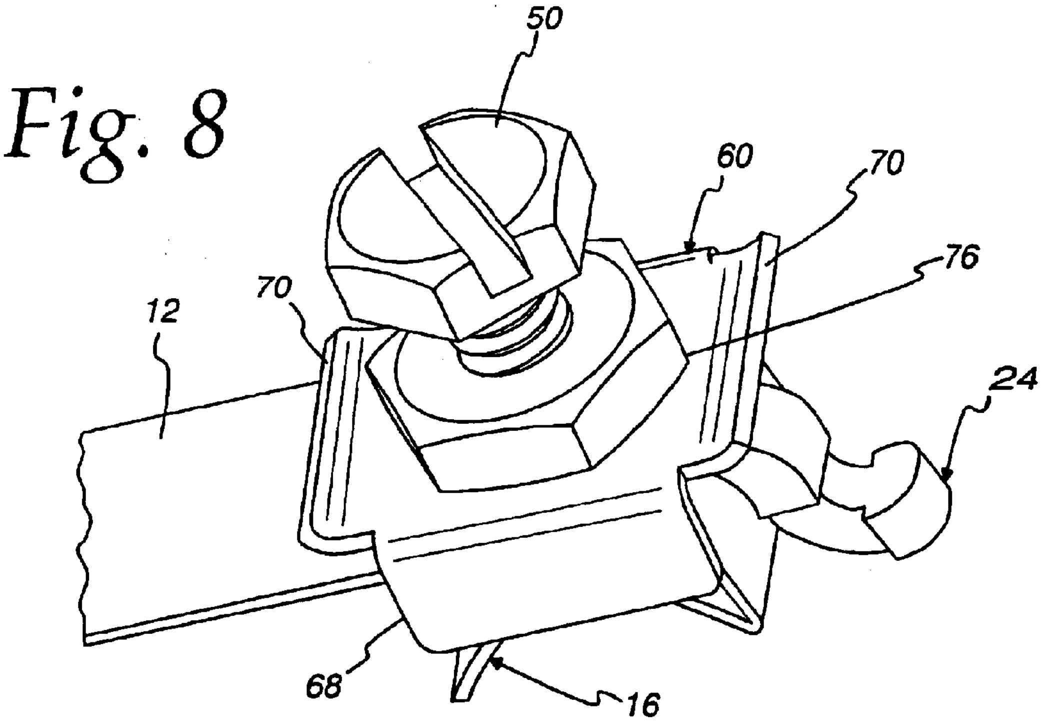
FIG. 8 is an enlarged side, perspective view of an end of the strap assembly of FIG. 1.

As shown in FIG. 8, the grounding clip 60 is mounted to the strap 12 by passing the fastener 50 through the bore 64 of the grounding clip 60, the bore 52 of the strap 12, and the threaded bore 30 of the threaded member 20. Thus, the grounding clip 60 is located adjacent a top surface of the strap 12 and the threaded member 20 is located adjacent a bottom surface of the strap 12. When so assembled, the downwardly extending flanges 68 of the grounding clip 60 are located on opposite sides of the bendable ground strap 12, one of the upwardly oriented flanges 70 is located above the strap 12, and the oppositely located, upwardly oriented flange 70 is located above the hook 24. Thus, a conductor 11 can be easily inserted under the upwardly oriented flange 70 and between the grounding clip 60 and the bendable ground strap 12 as shown in FIG. 10.

A ground nut 76 carried by the fastener 50 may then be tightened down to securely clamp the conductor 11 between the grounding clip 60 and the strap 12. As shown in FIG. 8, the ground nut 76, (which may be implemented by any known nut such as a brass hexagonal nut), is located adjacent the top of the body 62 of the grounding clip 60. Thus, when the ground nut 76 is tightened, it applies a force driving the body 62 of the grounding clip 60 downward toward the upper surface of the strap 12. As a result, the undersurface of the body 62 presses against the conductor 11 to trap the conductor 11 in electrical contact with the electrically conductive, strap 12. The downwardly oriented flanges 68 of the grounding clip 60 ensure that the ground wire does not escape from between the clip 60 and the strap 12 during this tightening process.

FIG. 9 illustrates the grounding strap assembly 10 mounted to an example electrically conductive structure 13. As shown in FIG. 9, the strap 12 is wrapped around the electrically conductive structure 13 with the arc 16 in electrically conductive engagement with an outer surface of the electrically conductive structure 13. When so positioned, one of the hook apertures 14 receives the point 26 of the hook 24. With the hook 24 received through an aperture 14, the fastener 50 is tightened. Tightening the fastener 50 with the end of the fastener 50 engaging the upper surface of the arc 16 causes the undersurface portion 38 of the strap 12 to move away from the arc 16 thereby causing the strap 12 to tighten onto the electrically conductive structure 13. The hook aperture 14 that receives the hook 24 may move slightly with respect to the point 26 of the hook 24 during this tightening process as permitted by the reduced width of the shank 28 of the hook 24 to thereby ensure that the strap 12 cannot separate from the hook 24.

Significantly, as shown in FIG. 9, because of the S-shaped shank 28 of the hook 24, the grounding strap assembly 10 may be secured to the hook 24 without wrapping the strap 12 over the grounding clip 60, and without removing the fastener 50 from the threaded member 20. In other words, the fastener 50 only passes through the strap 12 one time when the strap assembly 10 is secured to the electrically conductive grounding member 13. Thus, unlike prior art grounding straps, the example grounding strap assembly 10 illustrated herein may be secured to an electrically conductive structure 13 without ever removing the fastener 50 from the strap assembly 10 thereby eliminating an installation step and saving users of the strap assembly 10 the labor time associated with that eliminated step. Persons of ordinary skill in the art will appreciate that, since the fastener 50 need not be removed to install the grounding strap assembly 10, the potential to drop and/or lose the fastener 50 and/or the grounding nut 76 associated with installing prior art grounding straps is not present in the example strap assembly 10 illustrated herein.

The illustrated ground strap assembly 10 eliminates the need for overlapping and passing a fastener through the overlapped strap as present in prior art straps, because the shank 28 of the hook 24 extends downward a distance. This downward extension permits the end of the hook 24 to be upwardly inclined at a relatively steep slope. The steep slope of the end of the hook 24 ensures that the strap 12 remains on the hook 24 during tightening. The security of the attachment of the strap 12 and the hook 24 is further enhanced by the presence of the reduced shank segment adjacent the point 26 of the hook 24. In particular, once the strap 12 begins to tighten, the hole receiving the point 26 of the hook 24 moves off-center with respect to the hook 26 to thereby substantially prevent the hole from sliding back off of the hook 26.

The downward extension of the shank 28 is also advantageous in that it ensures that the free end of the strap 12 does not interfere with insertion of a conductor 11 beneath the grounding clip 60. Thus, in the illustrated assembly 10, a conductor 11 can be inserted between the strap 12 and the grounding clip 60 from either of two opposite ends.

The illustrated grounding strap assembly 10 may be secured to an electrically conductive structure 13 in the following manner. First, the grounding clip 60 is fastened to the ground strap 12 with the fastener 50. This fastening may be performed by the manufacturer such that the installer may not need to handle the assembly 10 with the fastener 50 removed.

The installer then engages the electrically conductive structure 13 with an engaging surface of the ground strap 12 such as the arc 16. The installer then wraps the ground strap 12 around the electrically conductive structure 13 and connects the ground strap 12 to the hook 24 extending from the ground strap 12. The fastener is tightened to secure the ground strap 12 to the hook 24. A ground wire is inserted between the grounding clip 60 and the ground strap 12, and the nut 76 is tightened to secure the ground wire beneath the grounding clip 60 in electrically conductive engagement with the ground strap 12.

Although the illustrated strap assembly 10 does not require removal of the fastener 50 and/or overlap of the strap 12 at the location of the bore 52 to mount the strap assembly 10 to an electrically conductive member, persons of ordinary skill in the art will appreciate that the illustrated example could be modified for use in the overlapping style, if desired. For example, the grounding clip 60 could be used with an overlapping strap with the grounding clip 60 being mounted adjacent the overlapping sections of the strap if such overlapping is desired.

As shown in FIGS. 11–16, a grounding shim 120 may be used with the exemplary strap assembly 10 to avoid the connection of two dissimilar metals. For example, such a connection may take place between a conductor, such as a copper wire, attached to the grounding strap assembly 10 and the strap 12, which may be made of galvanized steel. A connection of two dissimilar metals may cause a galvanic reaction, especially when moisture is introduced into the connector. That is, a small electric current flows between the two dissimilar metals, causing material to be removed from one of the metals in the form of metal ions. The amount of material removed from one of the metals is partially dependent upon the relative galvanic potentials or galvanic activities of the two metals. For example, see *CRC Handbook of Chemistry and Physics,* 75$^{th}$ Ed. (1995), Tables 2 and 3 on pages 8–26 through 8–31 or other similar reference materials on the topic of corrosion for a list of the galvanic series, the relative galvanic potential or activities (otherwise referred to as reduction potentials), of example compounds, metals, and alloys. Thus, in such circumstances, it may be desirable to use the grounding shim 120 in combination with a grounding clip 60, which are made of the same metal or metals with similar activities to the material from which the conductor is made. This minimizes the removal of material from one of the metals, otherwise known as galvanic corrosion, especially when a copper conductor 11 is attached to the grounding strap assembly 10. Preferably, the grounding shim 120 and grounding clip 60 may be formed from copper or brass, which has a galvanic potential similar to copper, in such cases, as these materials would minimize any galvanic corrosion which may occur with a copper conductor attached to the grounding strap assembly.

More specifically, the grounding shim 120 includes a body 128 defining a bore 126 which receives the fastener 50. The bore 126 is located so that it registers with the bore 30 of the threaded member 20, the bore 64 of the grounding clip 60, and the bore 52 of the strap 12. As such, the fastener 50 may pass through the grounding clip 60, the grounding shim 120, and the strap 12 and thread into the threaded member 20 and engage the upper surface 40 of the arc 16.

The body 128 is further provided with an arcuate, generally L-shaped front portion 122 that defines a cutout 130 which corresponds with the location of the hook 24 of the threaded member 20. While a generally L-shaped configuration is preferred, those skilled in the art will recognize that any configuration which accommodates the hook 24, such as differently shaped apertures or cutouts, may be used in place of the L-shaped portion 122 and the cutout 130. The body 128 and the L-shaped front portion 122 form an angle which complements the angle between the strap 12 and the adjoining end segment 42. The cutout 130 is sized to permit sufficient projection of the hook 24 of the threaded member 20 after the threaded member 20 has been inserted into the capture space 36 of the strap 12. Preferably, the grounding shim 120 is formed from copper or brass, such as from 0.010 inch stiff brass and, when using the grounding shim 120, the grounding clip 60 also is preferably formed of a similar copper or brass material, such as 0.040 inch hard brass.

The body 128 also includes a hook or receiver 24 which wraps around one of the longitudinal edges of the strap 12. The hook 24 acts as a stop and prevents rotation of the grounding shim 120 relative to the strap 12. The hook 24 and the L-shaped portion 122 cooperate to limit rotation of the grounding shim 120 relative to the strap 12. Further, the hook 24 aids in the insertion of the conductor 11 between the grounding clip 60 and the grounding shim 120 by ensuring that the body 128 of the grounding shim 120 is generally against the strap 12 when the conductor 11 is inserted therebetween.

Figure 16:
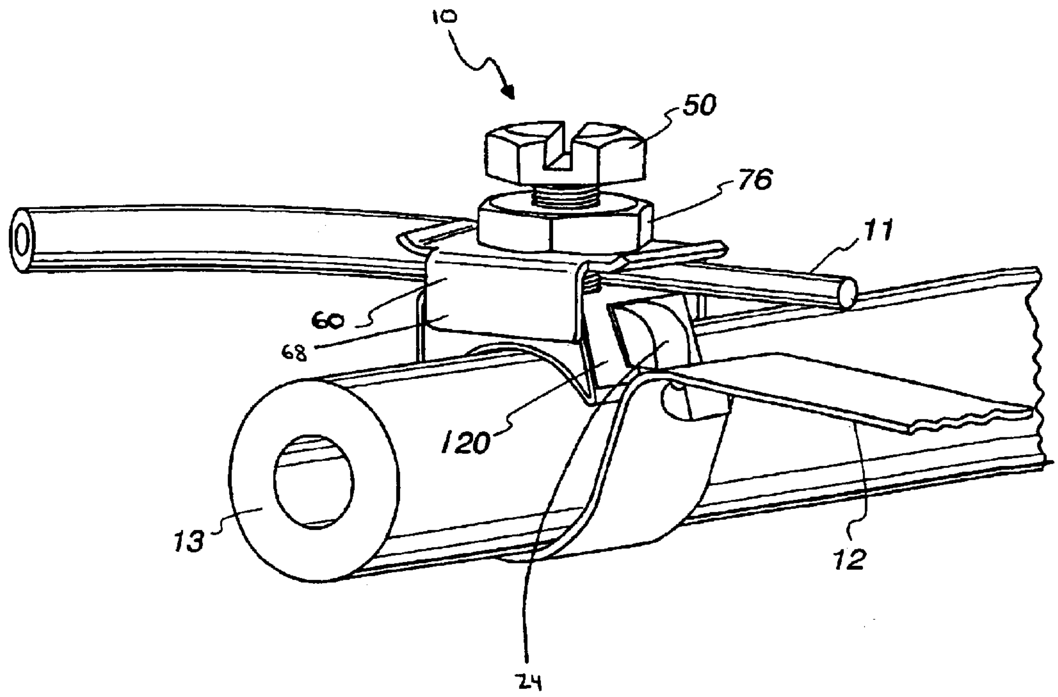
FIG. 16 is a perspective view of the ground strap of FIG. 11 mounted on an electrically conductive member and showing an attached ground wire.

As shown in FIG. 16, the grounding strap assembly 10 using the ground shim 120 is secured to an electrically conductive structure 13. The fastener 50 passes through the bore 64 of the grounding clip 60, the bore 126 of the grounding shim 120, and the bore 52 of the strap 12, and, then, threads into the threaded bore 30 of the threaded member 20. When so assembled, the downwardly extending flanges 68 of the grounding clip 60 are each adjacent one of the opposite longitudinal edges of the strap 12, one of the upwardly oriented flanges 70 extends over the strap 12, and the oppositely located, upwardly oriented flange 70 extends above the hook 24. Thus, the conductor 11 can be easily slid under the upwardly oriented flange 70 and between the grounding clip 60 and the grounding shim 120, as shown in FIG. 16.

The ground nut 76 carried by the fastener 50 may then be tightened down to securely clamp the conductor 11 between the grounding clip 60 and the grounding shim 120. Therefore, the conductor 11, which is commonly a copper wire, is clamped into electrical contact with the grounding clip 60 and the grounding shim 120, which are preferably copper or brass. Thus, the conductor 11 is in electrical contact with the same metal or metals with similar activities, which minimizes any galvanic corrosion of the conductor 11, grounding clip 60, and the grounding shim 120. Even in circumstances where some galvanic corrosion occurs, if any, it is minimized because of the larger area of contact between the grounding shim 120 and the strap 12.

While only specific embodiments of the invention have been described and shown, it is apparent that various alterations and modifications will be understood by persons of ordinary skill therein. It is, therefore, the intention in the appended claims to cover all such modifications and alterations as may fall within the scope and spirit of the appended claims, either literally or under the doctrine of equivalents.

I claim:

1. An electrical connector for use in connecting a conductor to an electrically conductive structure, the connector comprising:

a bendable strap for mechanically and electrically securing the connector to the electrically conductive structure;

a clip having at least one flange located to substantially prevent rotation of the clip relative to the bendable strap;

a shim;

a fastener securing the clip and the shim to the clamp such that the conductor can be captured between the clip and the shim; and the clip and the shim being made of conductive material with same or generally similar galvanic potentials as the material of the conductor.

2. An electrical connector in accordance with claim 1 wherein the shim includes at least one stop located to substantially prevent rotation of the shim relative to the bendable strap.

3. An electrical connector in accordance with claim 2 further comprising a threaded member defining a threaded bore for receiving the fastener, the clip defines a second bore for receiving the fastener, the shim defines a third bore for receiving the fastener and the strap defines a fourth bore for receiving the fastener, and wherein the fastener is positioned within the threaded bore, the second bore, the third bore and the fourth bore.

4. An electrical connector in accordance with claim 3 wherein the threaded member includes a hook and the end of the bendable strap defines a fifth bore positioned to received the hook such that the hook extends through the bendable strap with the threaded bore on one side of the bendable strap and the hook on an opposite side of the bendable strap.

5. An electrical connector in accordance with claim 4 wherein the shim surrounds at least a portion of the hook.

6. An electrical connector in accordance with claim 5 wherein the bendable strap defines a hook aperture positioned to receive the hook when the bendable strap is wrapped around the electrically conductive structure.

7. An electrical connector in accordance with claim 6 wherein the clip and the shim comprise copper.

8. An electrical connector in accordance with claim 6 wherein the clip and the shim comprise brass.

9. An electrical connector for connecting a conductor to an electrically conductive structure, the connector comprising:

a clamp securing the connector to the electrically conductive structure;

a grounding clip;

a grounding shim;

a bendable strap;

a fastener securing the grounding clip, the grounding shim, and the bendable strap together and to the clamp; and wherein a conductor can be captured between the grounding clip and the grounding shim, the grounding clip and the grounding shim being made of metals with the same or similar galvanic potentials as the material of the conductor.

10. An electrical connector in accordance with claim 9 wherein the bendable strap includes the clamp.

11. An electrical connector in accordance with claim 9 wherein the grounding clip and the grounding shim comprise copper.

12. An electrical connector in accordance with claim 9 wherein the grounding clip and the grounding shim comprise brass.

13. An electrical connector in accordance with claim 9 wherein the conductor comprises copper, the grounding clip and the grounding shim comprise copper, and the bendable strap comprises galvanized steel.

14. An electrical connector in accordance with claim 9 wherein the conductor comprises copper, the grounding clip and the grounding shim comprise brass, and the bendable strap comprises galvanized steel.

15. An electrical connector assembly for connecting a conductor to an electrically conductive structure comprising:

a bendable strap;

a grounding clip;

a grounding shim; and a fastener securing the grounding clip and the grounding shim to the bendable strap.

16. An electrical connector in accordance with claim 15 wherein the grounding clip and the grounding shim are made of materials with the same or similar galvanic potentials as the conductor.

17. An electrical connector in accordance with claim 16 wherein the grounding dip includes at least one flange located to substantially prevent the rotation of the clip relative to the bendable strap.

18. An electrical connector in accordance with claim 17 wherein the at least one flange is positioned adjacent a side of the bendable strap.

19. An electrical connector in accordance with claim 17 wherein the at least one flange comprises a first flange and a second flange opposite the first flange, the first flange and second flange being downwardly oriented.

20. An electrical connector in accordance with claim 17 wherein grounding clip includes at least one upwardly oriented flange located to facilitate the insertion of the conductor between the grounding clip and the grounding shim.

21. An electrical connector in accordance with claim 20 wherein the at least one upwardly oriented flange comprises a first upwardly oriented flange and a second upwardly oriented flange located opposite the first upwardly oriented flange.

22. An electrical connector in accordance with claim 16 wherein the grounding dip defines a bore for receiving the fastener.

23. An electrical connector in accordance with claim 16 wherein the grounding shim is disposed adjacent a first surface of the bendable strap and the connector further comprises a threaded member having a body disposed adjacent a second surface of the bendable strap opposite the first surface.

24. An electrical connector in accordance with 23 wherein the threaded member defines a threaded bore for receiving the fastener.

25. An electrical connector in accordance with claim 24 wherein the grounding clip defines a first bore, the grounding shim defines a second bore, and the bendable strap defines a third bore; wherein the threaded bore is registerable with the first, second, and third bores.

26. An electrical connector in accordance with claim 25 wherein an end of the bendable strap is bent downward to form a first portion, a second portion, and a third portion; wherein the threaded member is disposed between the first portion and third portion.

27. An electrical connector in accordance with claim 26 wherein the third portion is formed to mate with the electrically conductive structure.

28. An electrical connector in accordance with claim 26 wherein the threaded member includes a hook and the second portion of the bendable strap defines an aperture through which the hook extends.

29. An electrical connector in accordance with claim 28 wherein the hook extends downwardly and outwardly from the body of the threaded member.

30. An electrical connector in accordance with claim 16 wherein the grounding shim includes a body portion and an end portion and an end of the bendable strap is bent to form a first portion, a second portion, and a third portion; wherein the first portion and the second portion of the bendable strap define a first angle and wherein the body portion and the end portion of the grounding shim define a second angle which corresponds to the first angle.

31. An electrical connector in accordance with claim 30 wherein the end portion of the grounding shim defines an aperture through which the hook of the threaded member extends.

32. An electrical connector in accordance with claim 30 wherein the body portion of the grounding shim defines a bore for receiving the fastener.

33. An electrical connector in accordance with claim 16 wherein the connector further comprises a nut secured to the fastener, the nut located between a head of the fastener and the ground clip.

34. A method for grounding a conductor comprising:

providing an electrical connector with a grounding clip, a grounding shim, and a bendable strap, wherein the grounding clip and the grounding shim are formed from metals with the same or similar galvanic potentials as the material of the conductor;

fastening the grounding clip, the grounding shim, and the bendable strap together with a fastener;

inserting a conductor between the grounding clip and the grounding shim;

clamping the conductor between grounding clip and the grounding shim such that unintentional removal is prohibited; and securing the bendable strap to a electrically conductive structure.

35. A method according to claim 34 wherein the fastener includes a nut and the conductor is secured between the grounding clip and the grounding shim by tightening a nut adjacent the grounding clip.

* * * * *